United States Patent [19]

Bosse

[11] Patent Number: 4,639,915
[45] Date of Patent: Jan. 27, 1987

[54] HIGH SPEED REDUNDANCY PROCESSOR

[75] Inventor: Gene P. Bosse, Newberry Park, Calif.

[73] Assignee: Eaton Corporation, Cleveland, Ohio

[21] Appl. No.: 648,674

[22] Filed: Sep. 10, 1984

Related U.S. Application Data

[63] Continuation-in-part of Ser. No. 539,511, Oct. 6, 1983, Pat. No. 4,586,178.

[51] Int. Cl.$^4$ .............................................. G06F 10/20
[52] U.S. Cl. ......................................... 371/10; 371/21
[58] Field of Search ............................ 371/10, 11, 21; 365/200, 210

[56] References Cited

U.S. PATENT DOCUMENTS

| | | | |
|---|---|---|---|
| 4,460,997 | 7/1984 | Harns | 371/10 |
| 4,556,975 | 12/1985 | Smith | 371/10 |
| 4,566,081 | 1/1986 | Ochii | 371/10 |

Primary Examiner—Michael R. Fleming
Attorney, Agent, or Firm—Fay, Sharpe, Fagan, Minnich & McKee

[57] ABSTRACT

A method and apparatus for rapidly testing arrays of cells, such as memory devices, in which a limited number of redundancy rows and columns are available for repair. Repairs are to be made by substituting redundant rows and columns for original rows and columns of the array that contain faulty cells. The repair information as to whether a row or a column is to be substituted for a faulty original cell is determined, at least in part, in real time as the cells are being sequentially tested. E.g., a redundant row is assigned to replace any original row in which the number of faulty cells identified thus far in the testing, exceeds the number of redundant columns that have not as yet been assigned. Depending upon the pattern of faults, impossibility of repair may be detected, and the test aborted. Post-test data processing may be necessary to complete the repair information.

8 Claims, 16 Drawing Figures

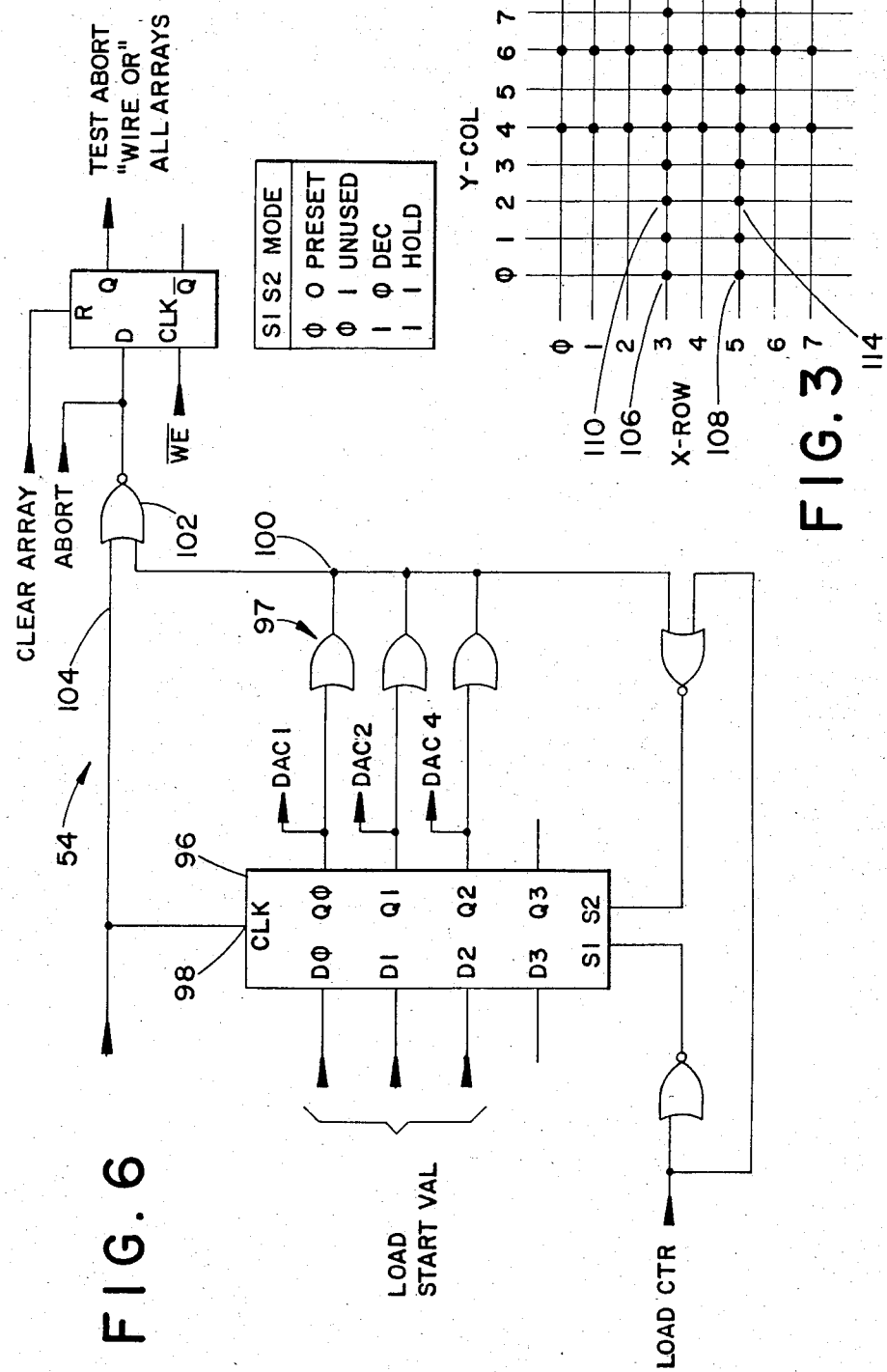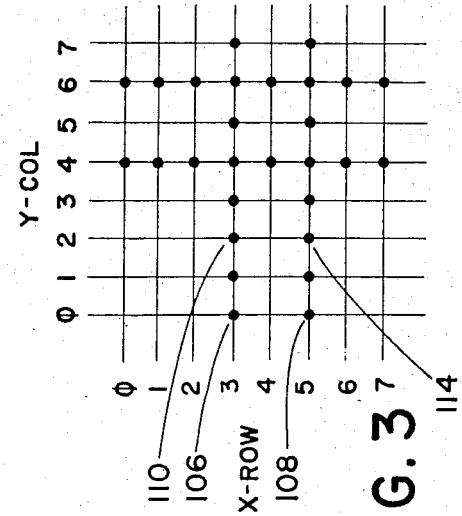
FIG. 6
FIG. 3

HIGH SPEED REDUNDANCY PROCESSOR

This application is a continuation-in-part of application Ser. No. 539,511, filed on Oct. 6, 1983, now U.S. Pat. No. 4,586,178.

BACKGROUND

A redundantly repairable array device is one which contains a main array and spare elements, often built adjacent the main array, which can be substituted for defective original elements of the main array in order to repair it. A redundant memory device may, for example, be a rectangular array of memory cells each of whose elements, i.e., rows and columns, comprises a plurality of individual memory cells, and which also has several redundant rows and redundant columns of cells. If the main array contains a faulty cell, it can be repaired by replacing either the entire row or entire column which contain the faulty cell, with a redundant element. If several cells are faulty one or several redundant elements may be employed, and the choice of whether to repair a particular cell by replacing the row of which it is a member or the column of which it is a member, can be more difficult. Incorrect choice may result in exhaustion of the redundant elements before a complete repair plan has been devised and the consequent rejection of an array for which a correct choice would have enabled a complete repair. After assignments of redundant elements have been made to cover all of the faults, the memory array may be sent to a laser "trimmer" for execution of the repair plan. In some cases it may be impossible to devise a plan that would enable repair of all of the faults with the limited number of redundant elements that are available.

The use of redundant elements for repair can increase the yields of array products significantly. Bubble memory manufacturers have used the redundancy technique extensively, and it has become popular also in the manufacture of relatively high bit density devices such as 256K DRAMs.

Present techniques for assignment of redundant elements to faulty memory locations include a two step process. The first step would be to ascertain which elements of a memory array are faulty. The information obtained during this procedure along with information of the redundant rows and columns available would then be collated by means of an algorithm for computation of a replacement scheme which would result in an assignment of the redundant rows and columns in such a way to replace all of the defective memory locations, if such a replacement is then determined to be feasible.

The redundancy technique has some offsetting disadvantages, however, two of which are increased cost of testing the products and reduced throughput (average productivity). These disadvantages are related to the hardware and time that are required to determine whether the arrays are reparable and, if they are, what the repair instructions should be. Conventional array testers can require seconds or minutes to determine and specify the instructions that are required to make a repair. The time required to prepare repair instructions for an array has ordinarily been in addition to the time required to test it to identify its faulty cells. The result is small throughput, as few arrays can be tested and analyzed per hour. The invention is a cost-effective method and apparatus for alleviating these problems.

SUMMARY OF INVENTION

It is an object of the invention to provide a method and apparatus for rapidly testing the specifying repair information for array devices under test (called DUTs hereafter), whereby test data are examined as the testing proceeds, and if the information gathered thus far conclusively shows irreparability the DUT is rejected immediately, and if it shows that certain faults can be repaired only by assignment of a particular type (row or column) of redundant element, that type of element is assigned immediately.

It is a further object of the invention to provide a method and apparatus as described in the preceding object and whereby, in addition, some DUTs that require post-test data processing have the benefit at the outset of the post-test processing of partial solutions (of the problem of specifying repair information) produced during the real time testing, and also the benefit that the test results are collated in a manner that enables the use of various forms of post-test data processing (to produce or to complete the requisite repair information) that can be relatively rapid.

Still another object is to provide a method and apparatus as outlined above and which can process DUTs comprising multiple arrays, shared-arrays, and byte wide arrays.

Yet another object of the invention is to provide a method and apparatus for indicating that the array is irreparable when either the unique faulty row coordinates or unique faulty column coordinates exeed a preselected number computed from the number of initially available redundant rows and columns.

The invented apparatus can carry out a method of collating the row and column coordinates of faulty cells, and can often assign replacement elements as the cells of the DUT are being tested in real time.

For one class of fault patterns (i.e., of arrangements of faulty cells on an array), all of the necessary repair instructions can be prepared as the real time testing of the DUT proceeds, so that they are complete upon testing of the last cell.

In the case of a second class of fault patterns, which are irreparable, the fact that a DUT is irreparable can be discovered before all of its cells have been tested, and the DUT rejected without further loss of time.

A third class of fault patterns is such that the DUT is reparable, but that fact cannot be conclusively determined during the real time testing. Upon completion of that testing, the apparatus provides signals indicating that further processing of the data that was gathered, is required. Only incomplete repair instructions or perhaps none at all, were specified during the real time testing. Post-test data processing can complete the repair instructions.

Fault patterns of a fourth class are those of DUTs that are irreparable, but post-test data processing is required to determine that fact. At the end of the real time testing the invented apparatus indicates the need for post-test data processing.

Some common types of DUT faults, such as faulty decoders and breaks in the metalization of a semiconductor, are totally processed during the real time testing, so a rejection signal or the repair information is available before or immediately, at the conclusion of that testing. When post-test data processing is necessary, it may require only nanoseconds or microseconds, because of the manner in which the test data are collated. Failures of only one cell of a DUT and certain other individual cell failure patterns always require post-test data processing, but most of these patterns are of such a nature that their post-test data processing can be accomplished very quickly.

Each individual failure coordinate is accepted only once by the apparatus, even if it is presented multiple times. This feature allows the user to run multiple array tests to produce repair information that is a composite of all of the tests. The apparatus can process arrays that employ shared rows and shared columns. It can also process byte wide arrays.

All of the actions taken by the apparatus before completion of the real time testing are ones that are based upon test data gathered thus far, that, although not yet complete, are sufficient to show conclusively that the action taken cannot be avoided. These actions are as follows:

(a) Choice and assignment of a type of element (i.e., row or column) for repair of a string of faulty cells which would be impossible to repair with the other type of element because there aren't enough remaining redundant elements of that other type; this action is called auto-assignment.

(b) Rejection of DUTs for which there are so many faulty cells on a row that they cannot possibly be repaired by means of redundant columns and hence must be repaired if at all by means of a redundant row, but for which the supply of redundant rows has already been exhausted by other irremissible demands, so that repair of the DUT is impossible. (Also, a corresponding action exists for a depleted supply of redundant columns.)

(c) Rejection of any DUT having more faults than can be repaired by the available numbers of redundant elements irrespective of the pattern in which the faulty cells are arranged, on the basis of a theoretical maximum number of faults.

(d) Rejection of any DUT having a number of unique failing elements (that is to say, faulty elements which share no row or column with another faulty element) that would make the DUT irreparable from the exhaustion of the initially available redundant row and column supply.

Thus, only actions which are mandatory are made by the apparatus during the real time testing.

BRIEF DESCRIPTION OF DRAWINGS

FIG. 3 portrays one array of memory cells which is under test, with some entire rows and columns of cells indicated as being faulty, and for which redundant rows and columns are to be substituted to repair the array.

FIG. 6 shows, in logic diagram form, the spare counter and abort logic circuits, which appear on FIG. 2 as spare column and spare row counters.

DETAILED DESCRIPTION OF INVENTION AND BEST EMBODIMENT

Figure 1:
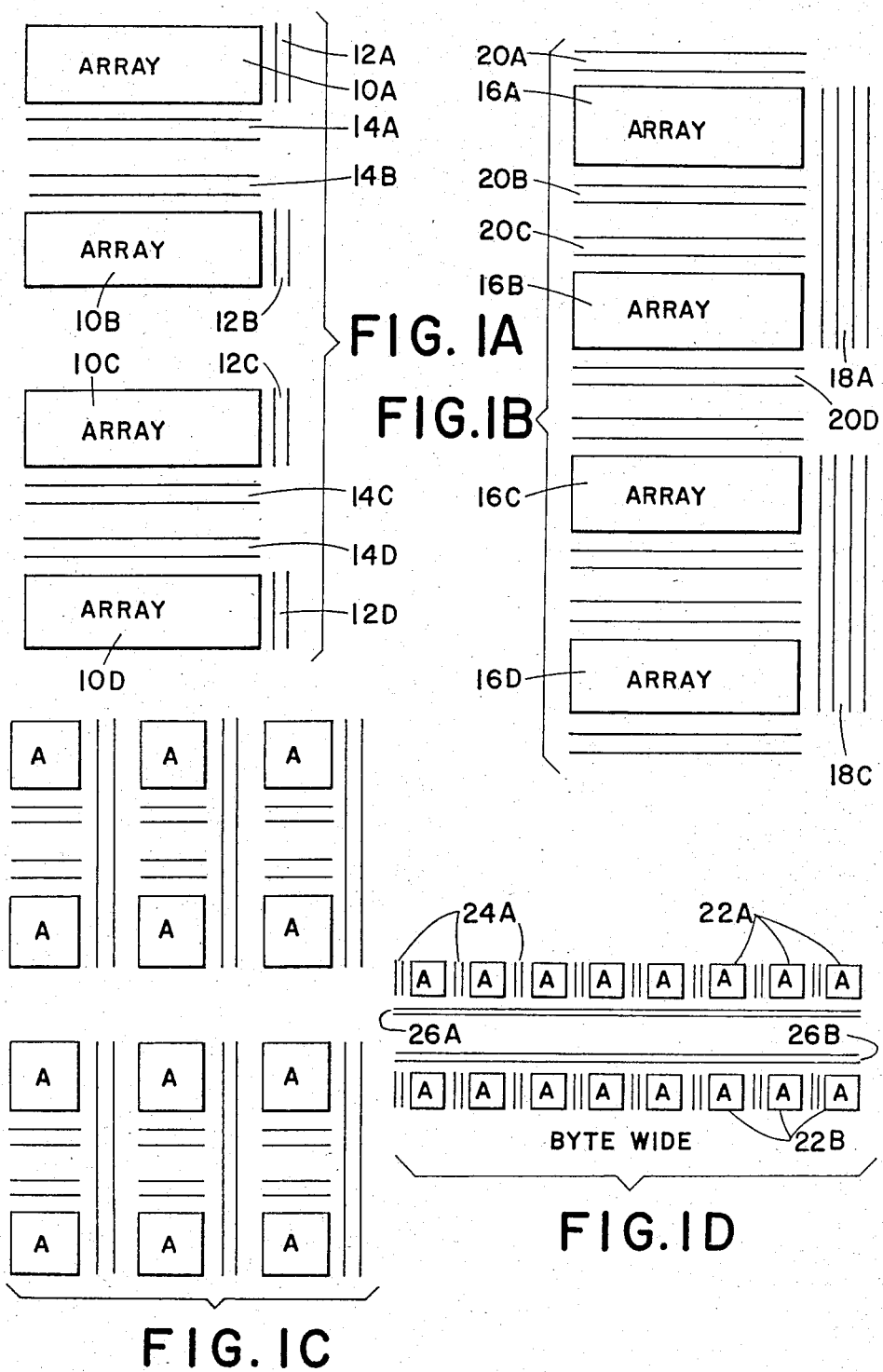
FIG. 1A shows an arrangement of four arrays of memory cells on a DUT, each of which has associated with it two redundant columns and two redundant rows of memory cells.
FIG. 1B shows a DUT having four arrays in which the upper two arrays share four redundant columns and the lower two arrays share four other redundant columns.
FIGS. 1C and 1D illustrate a few of innumerable other DUT configurations, FIG. 1D being a byte wide arrangement of arrays.

The invention is described by reference to a best embodiment in a specific application, to which, however, the invention is not limited. In FIG. 1A a DUT has four arrays 10A, 10B, 10C, and 10D, each of which comprises a plurality of semiconductor memory cells (not individually shown) arranged in rows and columns. Each cell is capable of storing one bit. Sets of two redundant columns 12A, 12B, 12C, 12D are associated with each of the arrays, as are sets of two redundant rows 14A, 14B, 14C, 14D.

The rows and columns of each array and its redundant rows and columns are interconnected, and are connected with other apparatus not shown, by means of conductive paths that can be individually interdicted by laser or other means to enable the redundant rows and columns to be substituted for any of the rows and columns of their associated array. If desired, it would not be difficult to arrange the interconnecting circuits in such a way that four of the redundant rows could be available for repair of either or both of the two arrays 10A and 10B in the upper half of the figure. Various manners of interconnecting them are well known and are not relevant to this invention.

In a similar manner rectangular arrays of cells can be disposed on a semiconductor substrate in the configuration shown in FIG. 1B. The two upper arrays 16A, 16B share a group 18A of four redundant columns of memory cells, and the two lower arrays 16C, 16D share the other group 18C of four redundant columns. In this arrangement, if one of the redundant columns of the group 18A is substituted for a column of the array 16A that has one or more faulty cells, the correspondingly positioned column of array 16B is also replaced by the same redundant column, irrespective of whether or not the replaced column of array 16B contains any faulty cells. Repair information for the arrays 16A and 16B, which would comprise assignments of redundant rows 18A and redundant columns 20A, 20B, 20C and 20D, could be generated as though the pattern of faults of the array 16A were superimposed upon the pattern of faults of the array 16B. Another possible arrangement of arrays and their redundant rows and column is shown in FIG. 1C by way of further example.

FIG. 1D includes eight arrays 22A, each of which has two redundant columns 24A available for its repair. In this byte wide plan each of the eight bits of any one byte is in a different one of the arrays 22A. Two redundant rows 26A are available for replacement of faulty cells of any of the arrays 22A by substitution for identically numbered rows in all eight of the arrays 22A. The redundant rows 26B could also be made available for repair of the arrays 22A on a sharing basis with a second byte wide group of arrays 22B, and the redundant rows 26A could similarly be shared with the arrays 22B.

The assignment of a redundant row to correct the faults on an original row is in certain circumstances an inescapable portion of any workable repair plan for a particular DUT. When the number of faulty cells on one row exceeds the number of redundant columns that are available to make repairs, the repair of these cells clearly cannot be left to the columns—a redundant row must be assigned. This can be seen by noting that each of the faulty cells on the row in question has a different Y coordinate, so if an effort were made to make the repairs by means of redundant columns, each of the faulty cells would require a different redundant column. However, there are not enought redundant columns available to cover all of the faults. Redundant columns cannot therefore cope with such a pattern of faults, and it is a compulsory step of any workable repair plan that a redundant row be assigned. A redundant row is therefor automatically assigned as soon as sufficient data are gathered to indicate such a condition. The high speed redundancy processor does this.

Figure 9:
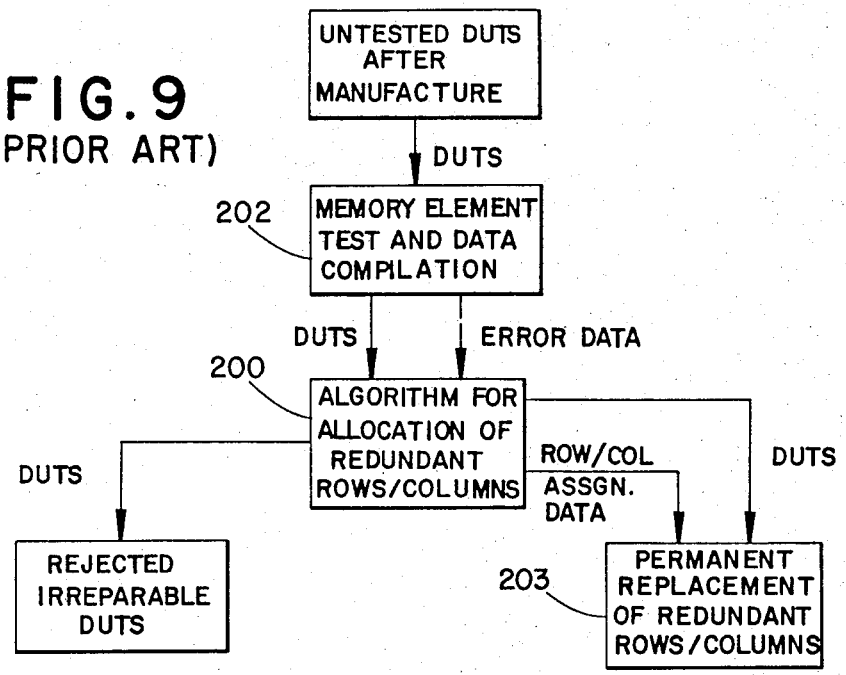
FIG. 9 is a flow chart depicting a pair art method for testing and assignment of replacement rows and columns for memory devices.

FIG. 9 depicts how a typical test repair scheme might have been set up in the prior art. A DUT would first be tested in 202 to map out the faulty memory elements. The data on the faulty memory elements would then be sent to an algorithm 200 together with data on the number of redundant rows and columns available for replacement. The algorithm would then begin the mapping of a replacement scheme which would repair all of the faulty elements. If no such scheme could be calculated, the DUT would be rejected as irreparable. If a satisfactory replacement scheme could be calculated, the resultant row and column assignment information, together with the DUT, would be sent for permanent implementation into the DUT by a means such as a laser trimmer.

Figure 10:
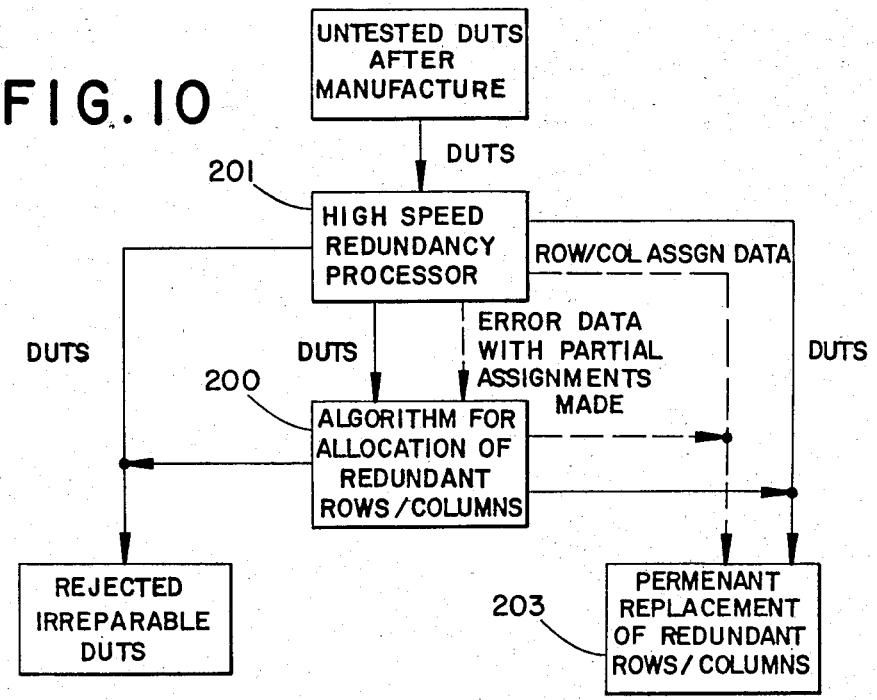
FIG. 10 depicts a flow chart illustrating the method of the present invention.

FIG. 10 depicts the test/repair scheme as it may be implemented with the invention. The high speed redundancy processor 201 would allow for assignments of redundant rows and columns while performing the test routine of 202 (FIG. 9). This first stage of assignment would allow for some DUTs to proceed directly to 203 for permanent engrafting of the replacement pattern. Other DUTs will be determined to be irreparable and will be rejected, again without the necessity of application of the time consuming replacement algorithm. The remaining will go to the algorithm 200, along with information from 201 about the number of redundant rows and columns still available for replacement. The rows and columns that have been replaced in 201 will be masked from future reconsideration in 200. When the redundancy process is thereby implemented, the number of devices sent for continued testing will be lessened. Of those DUTs which are sent for further testing, the work which the algorithm must perform will also be lessened insofar as all of the auto-assignments have already been made. The minimization of the number of devices sent to 200, along with the assignments which have already been made, will markedly improve the test/repair throughput time in that the inherently slow process of the algorithm allocation will be circumvented or supplemented.

Figure 2:
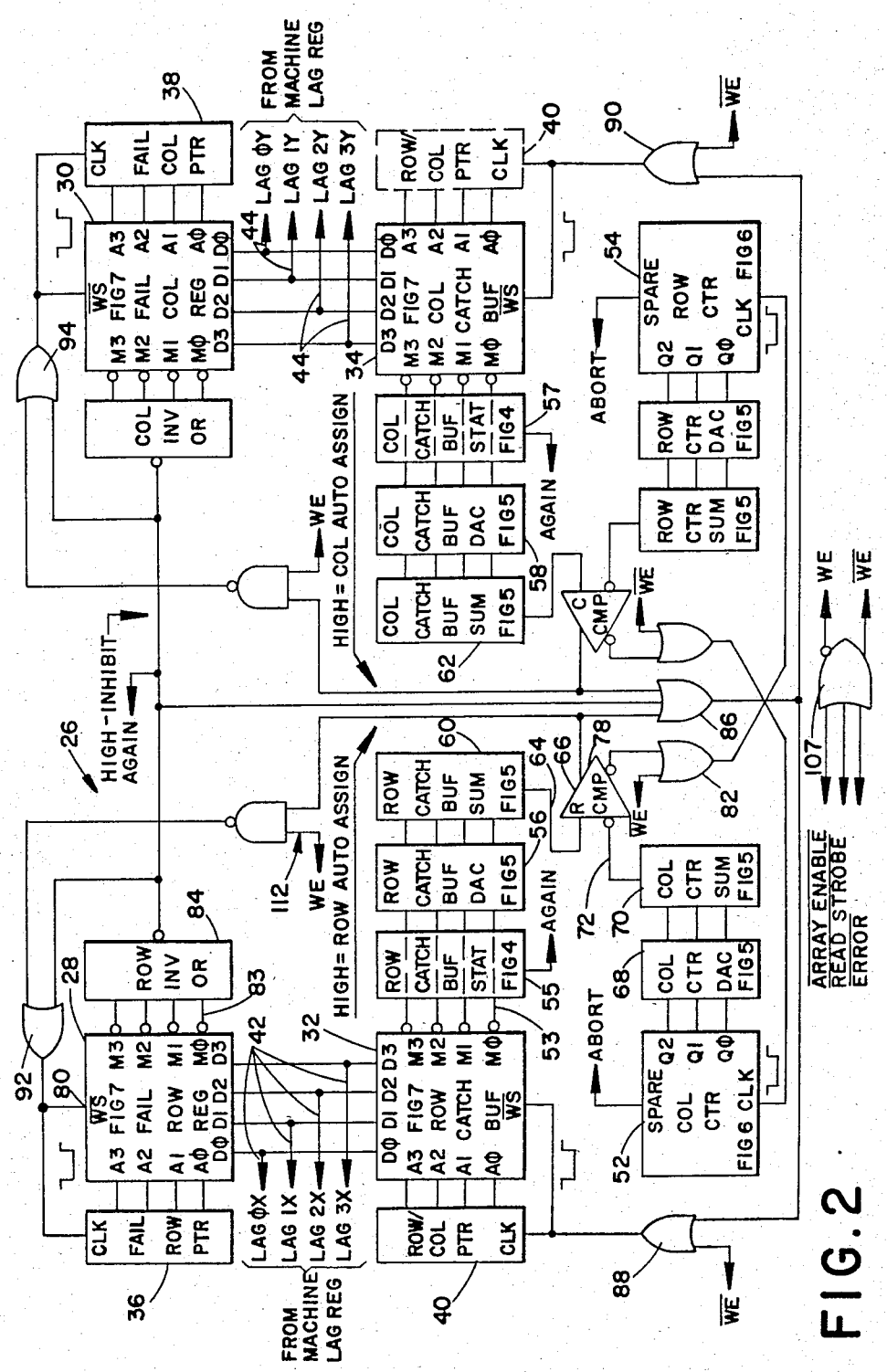
FIG. 2 is a simplified logic block diagram that includes the principal components of a portion, called a capture circuit, of the invented apparatus.

The high speed redundancy processor comprises sixteen programmable capture circuits 26, a simplified diagram of one of which is the subject of FIG. 2. (The logic symbols employed in all of the figures are standard in the industry; on the figures "WE" means write enable and "WS" means write strobe.) Description of circuits and functions that are well known in the prior art are omitted. The apparatus as a whole includes not only the high-speed redundancy processor circuit, but other probe, pattern generator, scratch pad memory, etc., components. Some of them are described below with reference to FIG. 8 to assist in explaining the invention. Sixteen arrays on one or more DUTs can be placed in the apparatus at once for simultaneous testing in real time, but only one array at a time can communicate with some of the ancillary equipment. Each has its own capture circuit as exemplified by the capture circuit 26. The capture circuits are configured to match the topology of the DUT and its arrays. Cells of a DUT in the embodiment being described are addressed sequentially in order to test them.

The high speed redundancy processor carries out an algorithm by which, as the real time testing of cells proceeds, it assigns redundant rows for future repair of those of the faulty cells that can be repaired only by assignment of redundant rows, and it assigns redundant columns for future repair of those of the faulty cells that can be repaired only by assignment of redundant columns. When a capture circuit 26 has received data indicating that an array contains more faulty cells than its associated set of repair elements can correct, the test will be aborted and the apparatus will generate a status signal indicating rejection of the DUT.

The real time testing algorithm involves presenting the address coordinates of each faulty cell to catch buffer registers 32, 34, comparing the coordinates of that address with other information available thus far, and in some cases assigning a redundant row or column to the faulty cell. Such an assignment is called an auto-assignment. Upon making an auto-assignment the apparatus accepts one address coordinate of the faulty cell that will be thus repaired, into one of its fail registers 28, 30 and sets a corresponding status bit of catch buffer status circuits 55, 57, to indicate that the auto-assignment has been made.

Before testing of a DUT is begun all locations of the fail register 28, 30 and catch buffers 32, 34 are cleared, i.e., initialized, so as to contain 1's in all of their stages; this simulates a very large address in each location, which is greater than any address that they will receive during the functional testing.

As the individual cells of a DUT are sequentially tested the X and Y coordinates of cells that produce fault indications are captured in the catch buffer registers 32, 34.

Figure 7:
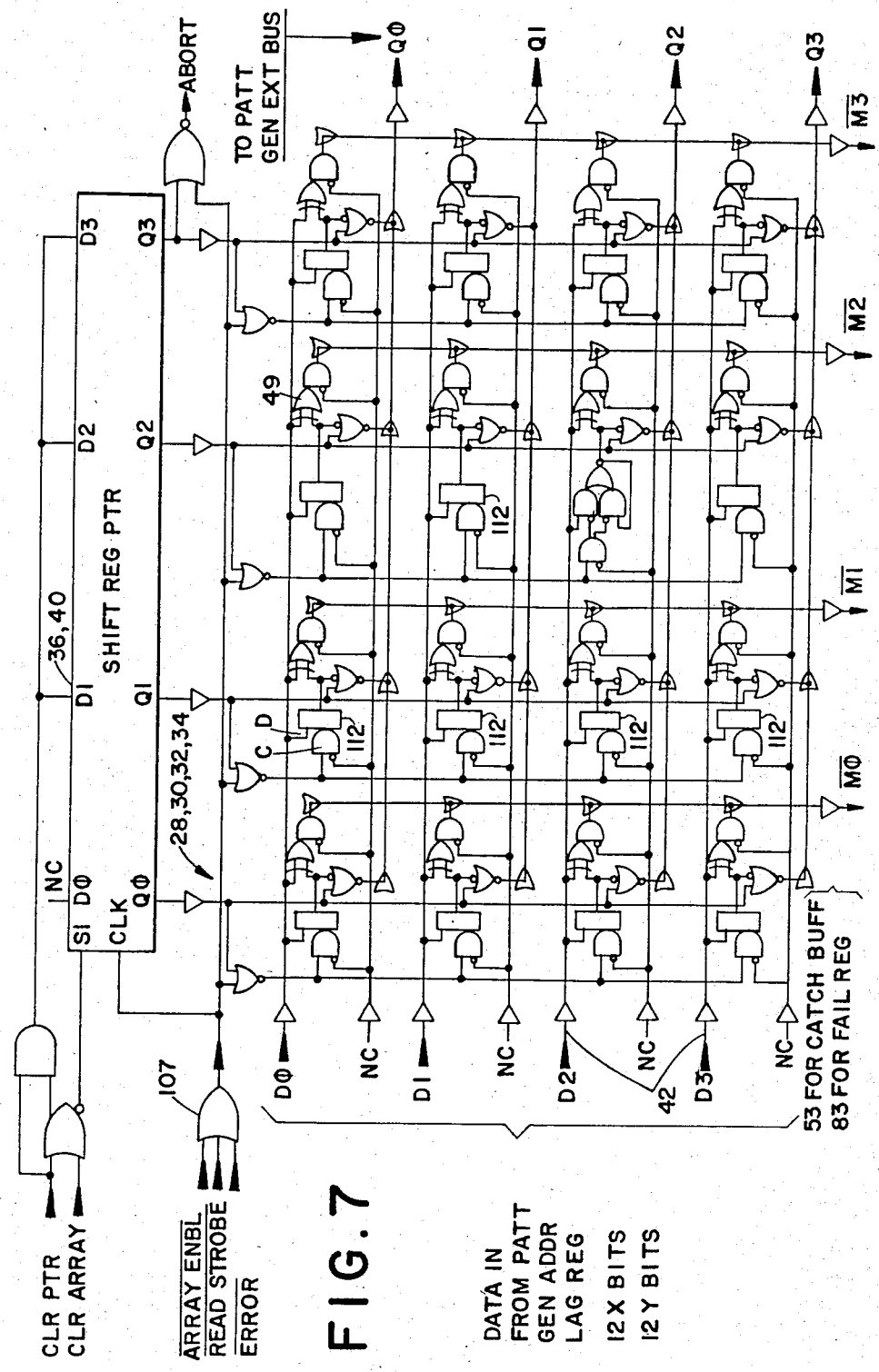
FIG. 7 provides more details than are provided in FIG. 2, of logic circuits that are included in the fail registers and catch buffers.

The row catch buffer 32 contains a plurality of register locations, each of which is twelve bits wide. The column catch buffer 34 is identical to the row catch buffer 32 (and they are very similar to the fail registers 28, 30). All are depicted by the same diagram in FIG. 7. In FIG. 7 there was a space shortage; each of the many flip-flops of the type denoted by reference 112 has a data input terminal D near the upper left corner of the rectangle, a clock input terminal C near the lower left corner, and an output terminal Q at the right side of the rectangle. Upon occurrence of a clock pulse at the terminal C the flip-flop latches into a state dependent upon the data standing at terminal D. The state of the flip-flop is indicated by a signal at the output terminal Q.

The row catch buffer 32 and the column catch buffer 34 share in common a pointer shift register 40. It is called the row/column pointer and is drawn once by solid lines and once by dotted lines at opposite sides of FIG. 2 for convenience in reading the circuits. The row/column pointer is initially cleared to enable only its first stage, after which its enabling pointer datum is shifted one stage each time that it is clocked, to enable the next higher location of both the row catch buffer 32 and the column catch buffer 34. The locations of the row catch buffer and column catch buffer that are enabled by the row/column pointer are the destinations for storage of the X and Y coordinates respectively of one faulty cell whose address is being "captured."

The fail column register 30, the column catch buffer 34, and their associated equipment are identical with (and operate in the same manner for columns as) the corresponding row equipment.

During real time testing, it is desirable to place each memory cell through a number of tests. This procedure is often referred to as multiple pattern testing. If the coordinates of a faulty cell are logged into the row/column catch buffers 32, 34, it would not be necessary to rewrite these coordinates into the registers should the coordinate once again be found to be faulty during a subsequent pattern test. The logic of FIG. 4 will compare the coordinates of the faulty cell with those that have been written into the registers 32, 34. If those coordinates have already been written, a signal AGAIN will be generated, disenabling the row/column catch buffers 32, 34, from reentering those coordinates.

After the real time testing has proceeded through a number of cells, several locations of the row catch buffer 32 may contain the X coordinate portion of addresses of faulty cells. These X coordinates are compared with incoming X coordinate data each time a new defective cell is discovered. The row catch buffer 32 includes logic circuits 49 (FIG. 7) for simultaneously comparing the contents stored in each of its locations with the address of a faulty cell that is coming in from the address lag register 46 on the conductors 42. Each location of the row catch buffer has its own independent compare circuit 49 and compare output circuit 53. (The compare outputs are independent from the address of the row/column pointer 40.) Whenever the contents of one of the row catch buffer locations matches the incoming fault address, the catch buffer 32 will produce a signal at its corresponding output line M0, M1, etc. of 53. For example, if the address at 42 matched the contents of the first and third row catch buffer locations of FIG. 7, M0 and M2 would produce an output signal.

The outputs of all of the compare circuits 49 of the catch buffer 32 are connected to a high-speed digital to analog converter (DAC) 56 (FIG. 2) which feeds a row catch buffer summer 60 to produce an analog output signal at a conductor 64, whose voltage value is a function of the number of locations of the row catch buffer having contents that match the incoming address (at 42) of the newly discovered faulty cell. Thus, the output of the analog summer 60 shows how many compare circuit outputs 53 match the incoming fault address.

The capture array 26 includes a spare column counter 52 and a spare row counter 54. The spare counters are initially loaded by the pattern generator 45 (FIG. 8) prior to the real time testing, with numbers equal to the numbers of redundant rows and columns that are initially available. The spare column counter 52 presents a digital output, which indicates the number of columns that are still available for repair assignments, to a column counter DAC 68, which operates with a column counter summer 70 to produce an output at a conductor 72, which is connected to an inverting terminal of the row comparison amplifier 66. The output of the summer 60 described above is compared in the row comparison amplifier 66 with the number of redundant columns that have not as yet been assigned. It should be noted that the number of matching rows is compared with the number of unassigned redundant columns.

Offset adjustment potentiometers 74 and 76 (FIG. 5) are set so that when the voltage signal at conductor 64 equals or exceeds the voltage signal at conductor 72, the row comparison amplifier 66 produces an output signal at its non-inverting output terminal 78 that initiates an auto-assignment of a redundant row.

This occurs when the output of the spare column counter 52 equals the output of the catch buffer DAC 56 and the existence of an additional faulty cell on the row in question has also been detected.

Upon auto-assignment of a row the spare row counter 54 is decremented one count by means of a signal from an inverting output of the row comparison amplifier 66 via an OR gate 82. The spare row counter 54 thereafter indicates a balance of one fewer redundant rows as being still available from the supply of redundant rows.

The capture circuit 26 of FIG. 2 includes the fail row register 28 and the fail column register 30, which is identical to it, FIG. 7. The fail row register 28 comprises a plurality of storage locations, each of which is twelve bits wide and can store the row coordinate (X coordinate) of the address of a faulty cell of a DUT.

The capture circuit 26 also comprises a shift register 36, FIG. 7, which is called a fail row pointer, and an identical shift register 38 called a fail column pointer, which are associated respectively with the fail row register 28 and the fail column register 30, each stage of the pointer corresponding to one of the address locations of a fail register. The pointers 36, 38 are cleared initially in such a way as to set only their first stage locations. Each time the fail row pointer 36 or column pointer 38 is clocked its indicating datum is shifted along one stage to enable the next higher numbered location of the corresponding fail register. The fail row pointer 36 and the fail column pointer 38 can be clocked independently.

In order to identify a faulty original row for which a redundant row is assigned to be substituted, the row portion of the address of the most recently identified faulty cell, which stands on the conductors 42, is written, upon auto-assignment into a location of the fail row register 28. A write command enters the fail row register 28 at a terminal 80, and also clocks the fail row pointer 36 to enable the next vacant location of the fail row register.

Following an auto-assignment such as that for the row described above, there is no need for concern about any subsequently discovered faults in the same row, so the apparatus is arranged to block such data. The array status and auto-assignment compare mask logic circuits of FIG. 4 take care of masking from future comparison the coordinates that have already been handled by auto-assignments. For clarity only four status flip-flops 95 and four status flip-flops 97 are shown, which correspond respectively to four locations of the row catch buffer 32 and four locations of the column catch buffer 34. The terminal S of each flip-flop sets the flip-flop and the terminal R resets it. Terminals Q and Q-bar are the asserted and inverted output terminals respectively, that indicate the state of the flip-flop.

When a coordinate is auto-assigned, the opposite coordinates of all of the same coordinates of that value are flagged to prevent them from being compared with new fault coordinates thereafter. For example, if a redundant row is auto-assigned for repair of a row, (say, X=3), there are already several fault addresses having X=3 in locations of the row catch buffer. (These are the "same coordinates of that value" referred above.) Each of those fault addresses has a Y coordinate also, which is stored in the like-numbered location of the column catch buffer 34. (These are the "opposite coordinates" referred to above.) The auto-assignment takes care of all of those faults having same (i.e., X) coordinates of that value (i.e., 3), so those faults should be masked from any further consideration in specifying repair information. Accordingly, the opposite (i.e., Y) coordinates of those corrected faults must be masked from comparison with subsequently discovered faults. When one of the flip-flops 95, 97 is set, the outputs of that flip-flop prevent future comparisons, in a manner to be described.

When a row auto-assignment signal occurs (i.e., it goes low), on the line 99 (FIG. 4), any of the negated OR gates 101 that has a 0 on its terminal 103 produces a 1 output, which sets its associated flip-flop 97. The signals at the terminals 101 come there from the compare outputs 53 of the row catch buffer 32, and signify for each location of the row catch buffer whether or not the X coordinate stored there matches the X coordinate of the address being auto-assigned.

Upon being set, a flip-flop 97 produces a 1 signal at its Q output terminal. This is connected in a wire OR circuit with the output of the corresponding column catch buffer compare output. It produces a masking signal for that location of the column catch buffer.

Upon being set, a flip-flop 97 also produces a 0 signal at its inverted output (Q-bar) terminal. If either flip-flop 97 or flip-flop 95 that corresponds to a like-numbered location of the catch buffer registers has been set, an AND gate 105 that receives signals from both flip-flops produces a 0 output. Its output connection is one of several inputs of a wire OR circuit whose output indicates absence or presence of a match status of the array being tested. That wire OR circuit's output is also employed with similar signals from other arrays of the DUT to indicate whether or not all of the arrays have a match status.

If a fail address that was auto-assigned is presented again, a comparison output 83 (FIG. 7) goes low and the output of a row inverter logic circuit 84 (FIG. 2) goes high. This disables both of the catch buffers 32, 34 and their pointer (via OR gates 86, 88 and 90) and the fail registers 28, 30 and their pointers (via OR gates 92 and 94). In this way both of the address coordinates of a subsequent fault are masked from further processing if either of its coordinates has already been covered by an auto-assignment.

If as the testing proceeds the necessity arises to assign a redundant row in order to repair a faulty original row, and the supply of redundant rows has already been exhausted, the apparatus recognizes that the DUT is irreparable, and it issues an abort signal to stop the test. Similarly, a demand for a redundant column will cause abortion of the test if the spare column counter is already indicating that no more redundant columns are available. This feature is illustrated in the drawings of the spare row counter 54 in FIGS. 2 and 6. A counting module 96 of the spare row counter is preloaded to the number of redundant rows by applying data to the terminals D0, D1, D2. This starting value is decremented by pulses applied to the clock terminal 98. The outputs of the counter's various stages are connected from terminals Q0, Q1, Q2 to the spare counter DAC 68 (FIG. 5), as well as to a wire OR circuit 97 whose output terminal 100 is connected to a negated OR gate 102. A second input of the gate 102 is connected to the clock terminal 98. When all stages of the module 96 contain zeroes the signal at terminal 100 is 0. If another downgoing clock pulse then appears at terminal 98, indicating another demand for a redundant row, the output of the negated OR gate 102 goes high. That is an abort signal, which is used to terminate the test program.

A DUT could have so many faults that it could not be repaired even by post test data processing of the highest degree of sophistication. The apparatus is alert to notice such hopeless situations as the testing of the cells proceeds, and aborts the test when it becomes apparent that no workable repair instructions could possibly exist. This occurs when the number of faults that have been recognized by the buffers exceeds the greatest number that can possibly be repaired by the number of redundant rows and redundant columns that are available. For example, if two redundant rows and two redundant columns were initially available for repair, the apparatus will abort the test of a DUT when the row/column catch buffer pointer reaches eight and one more writable fault is recognized thereafter. The maximum depth of the buffer pointer without its signalling that the test should be aborted is determined by the formula
$TE=2(SR)(SC)$,
where
TE=Total number of faults recognized by the buffers
SR=Initial number of redundant rows available
SC=Initial number of redundant columns available In the described embodiment this abort signal is provided by a negated OR gate 105 shown on FIG. 7, which is associated with the row/column pointer 40. When the number of addresses in the buffers is eight, the last stage of the pointer 40 contains an eight-count signal, and a subsequent pulse on the OR gate 107, representing another request to write data into the buffers, causes the gate 105 to emit an abort signal.

If at the end of the testing of a DUT not all of the faulty cells have received auto-assignments, the real time test algorithm has not produced complete repair instructions. Following the auto-assignments the fail row register 28 contains the addresses of rows that had more failures than the number of spare columns that were available for repair. If moreover there has been no conclusive evidence during the real time testing that the DUT is irreparable, post test processing of the test data is called for. If all faulty cells have been taken care of by auto-assignments no post test data processing is required.

The contents of the fail row register 28 and the fail column register 30 (and of the spare counters 52, 54) can be read into the pattern generator 45 via an external bus after real time testing. When the status of the capture circuit 26 is read back to the pattern generator a storage stage corresponding to each location of the fail row register contains a bit that represents the abort status. When any abort status bit of an array is 1 it indicates that that array was responsible for aborting the test of the DUT due to irreparability. This is helpful in quality control analysis.

The contents of the row catch buffer 32 can be read into the pattern generator 45 via an external bus 51.

Each address location of the row catch buffer shares a status bit with the corresponding address location of the column catch buffer. If either the row coordinate (stored in the row catch buffer) or the corresponding column coordinate (stored in the column catch buffer) is involved in an auto-assignment, their common status bit is set to zero. This enables the pattern generator 45 to determine quickly at the end of the real time testing whether or not a DUT requires any post test data processing in order to specify repair instructions completely.

The time required for post test data processing is much shorter than that required with previous techniques such as conventional but mapping because some of the faulty cell locations of many arrays are processed in real time, leaving far fewer locations to process in the post test data processing.

The ancillary pattern generator 45, (FIG. 8) associated with the high-speed redundancy processor includes limit registers called the X low limit, X high limit, Y low limit, and Y high limit registers. When the pattern generator 45 outputs an address that is equal to or greater than the X and Y low limits of an array and equal to or less than its X and Y high limits the corresponding capture circuit 26 is enabled to capture fault data during real time testing. Limit register values can be entered into the pattern generator 45 via the external bus 51 prior to commencement of real time testing.

Figure 8:
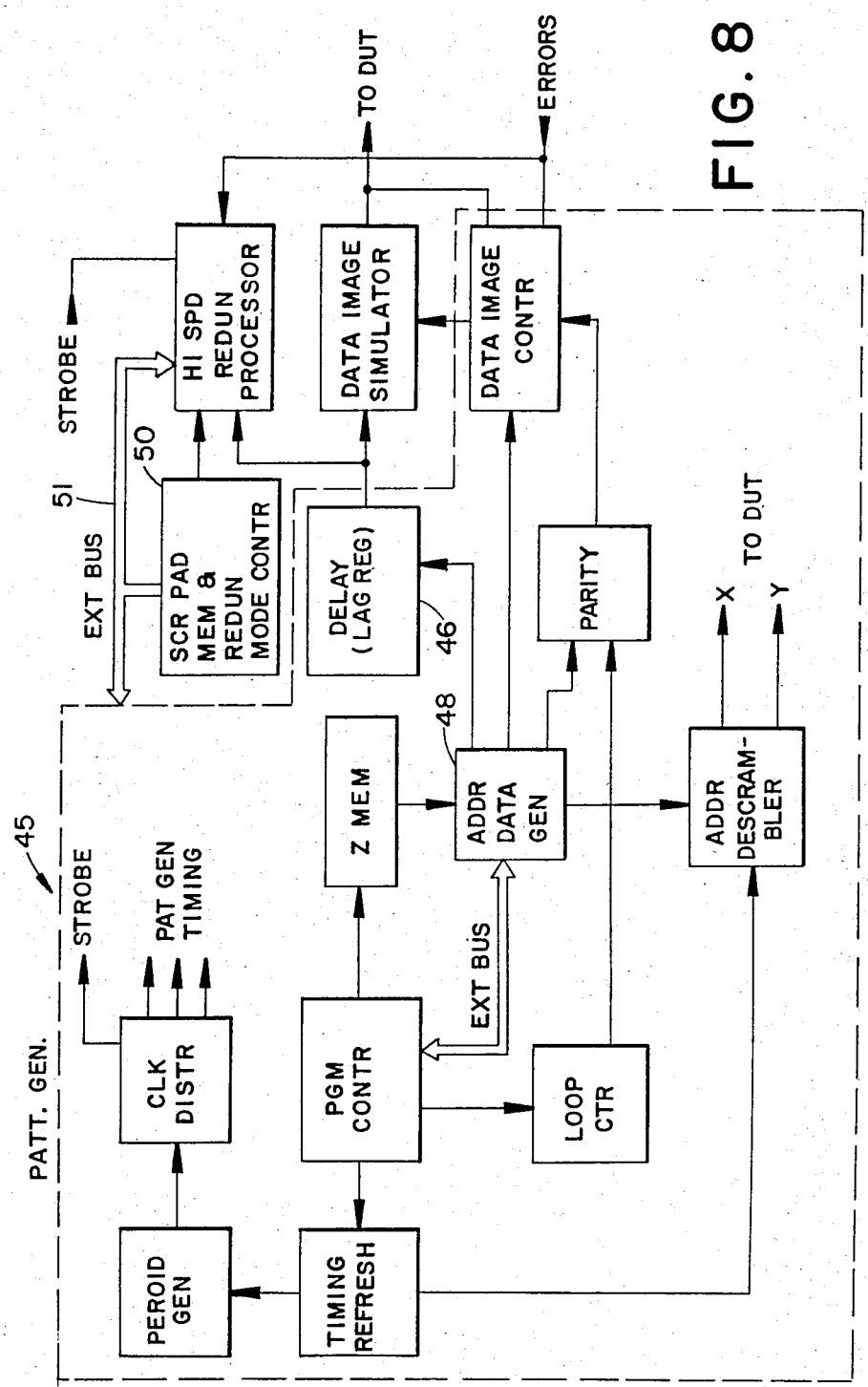
FIG. 8 is a simplified block diagram of a pattern generator containing an address data generator and other components that operate with the high speed redundancy processor. Their relationships to the high speed redundancy processor are depicted in simplified form.

Address data that are intended for entry into the catch buffers and the fail registers come to them via conductors 42, 44 from address lag registers 46 that are shown on FIG. 8 as the block "Delay." The address lag registers cause a delay in transmission of the addresses that are output by an address data generator 48 (FIG. 8) at least long enough to determine whether or not the test of the cell at the address indicated a fault. The address data generator 48 is a programmable circuit that states the address of the first cell of the array that is to be tested, then the second, etc., until all of the cells of the array have been tested.

The pattern generator uses a generic decode called the "assign command" in conjunction with the least significant five bits of an address pipeline to form an instruction set used to communicate with the high-speed redundancy processor. The set includes the following instructions:

Read only instructions: X low limit, X high limit, Y low limit, Y high limit, X catch buffer data, X fail register data, Y catch buffer data, Y fail register data, spare row counter, spare column counter Command instructions: Assign X value, assign Y value, sense status, zero points, clear arrays, assign 1's Real time test enabling instructions: Enable array 0, enable array 1, . . . enable array 15.

When the real time testing is complete the pattern generator 45 reads the catch buffer, fail register, and spare element counter registers of the capture circuits such as circuit 26, and the pattern generator uses a sense status command to indicate whether or not the array requires post test data processing. When the status signal is 0 it indicates that all of a circuit's catch buffer locations were involved in auto-assignments, and no further data processing is required for that array. The pattern generator will advance to its next memory location because the procedure is complete for the array that is presently enabled.

When the status is 1 it indicates that the array requires post test data processing, and the program will jump to a location specified by a jump field in order to perform it. Thus, the only command of the pattern generator's command field which requires a conditional branch is the sense status command. The assign command 17(a) acts like an NOP type of instruction, i.e., step onward to test the next numbered array, unless the sense status condition calls for post test data processing.

The command "assign X value" is used to write a row address into the fail row register. This command is produced by the pattern generator when processing the post test data processing algorithm and a fail row is detected. A corresponding "assign Y value" command is used for the fail column register.

Although a plurality of arrays may be tested simultaneously the capture circuit of only one array is enabled at a time when communicating with the pattern generator, as selected by the enable array command. This does not affect the capturing of failure coordinates, which is controlled by the limit registers. The enable array zero through fifteen command is overridden when an "assigned X" or "assigned Y" command is being executed and sharing is enabled.

In order for a capture circuit 26 to accept an address into any of its registers from the address lag register 46 the following conditions must be fulfilled:
1. The fault address presented by the address lag register 46 must lie between the start and stop topographical limits that were established for the particular capture circuit 26 (signified by the value of the "Array Enable" line of 107 (FIGS. 2, 7)).
2. The DUT must exhibit a defect upon testing at this address; the capture circuits are concerned only with faulty cells (signified by the value of the "Error" line of 107).
3. The address data generator 48 must have been performing a read cycle when the signal indicating a fault in the DUT occurred (signified by the "Read Strobe" line of 107).

When all of these conditions have been met, the WE (write enable) signal and its complement are generated at the output of 107.

An example of the operation of the invented apparatus follows, for a DUT array that has two redundant rows and two redundant columns per array. The particular DUT being processed will create the fault pattern shown in FIG. 3.

The fail registers 28, 30 and the catch buffer registers 32, 34 are cleared. The row and column spare counters 52, 54 are loaded with the number 2. Row members are X coordinates; column numbers are Y coordinates. The direction of scan of the array is unimportant; let the test pattern start at address X=0, Y=0, then increment X in unit steps to its maximum array address, then increment Y by one and again increment X from zero to its maximum, etc.

The first faulty cell address that is encountered is X=3, Y=0. When these coordinates are presented by the lag register 46 (FIG. 8) to the fail row registers 28, 30 and the catch buffer registers 32, 34, it will be found that they do not match the contents of any location of those registers since all locations contain the 1's clear value. X=3 is written into the first location of the row catch buffer 32, and Y=0 is written into the column catch buffer 34. The common pointer of the row/column pointer circuit 40 is then shifted one stage to enable the next locations of the row and column catch buffers.

The coordinates of the first faulty cell are not written into the fail registers 28, 30 because neither the coordinate X=3 NOR the coordinate Y=0 has been presented by faulty cells one more time than the remaining number of opposite redundant elements. The number of remaining opposite redundant elements is referred to hereafter as the opposite modulus. The opposite modulus of the row catch buffer 32 is the contents of the spare column counter 52, which in the present example is still its initial value. The first faulty cell 106 is indicated on FIG. 3.

The address data generator 48 steps the test along from cell to cell down the column Y=0 from top to bottom in FIG. 3 by sequentially generating addresses.

The next faulty cell 108 that is encountered in the course of the test pattern has the coordinates X=5, Y=0. If either opposite modulus were exceeded, both the X and Y coordinates would be blocked from being written into their respective catch buffers by operation of the OR gates 86, 88 and 90. This does not occur as yet in the present example because neither opposite modulus is exceeded. X=5 is written into the row catch buffer 32 and Y=0 is written into the column catch buffer 34. The row column catch buffer pointer 40 is advanced to the third location.

The next faulty cell is found at X=3, Y=1. No opposite repair and modulus is exceeded so X=3 is written into the row catch buffer and Y=1 into the column catch buffer, and the row/column pointer is advanced one step.

The next failure address is X=5, Y=1. These coordinates are also written into their respective catch buffers and the buffer pointer is again advanced.

The next faulty cell is found when the testing pattern reaches the coordinates X=3, Y=2 (cell 110 on FIG. 3). X=3 is recognized by the row comparison amplifier 66 as having more faults than its opposite modulus, because the coordinate X=3 already resides in two locations of the row catch buffer 32, and there are only two remaining redundant columns available. The non-inverted output 78 of the row comparison amplifier 66 is high, so an auto-assignment occurs. A write enable signal at terminal 112 (FIG. 2) goes high and the OR gate 92 outputs a downgoing pulse that admits the coordinate X=3 into the fail row register 28 from the conductors 42.

During the auto-assignment both of the catch buffers 32, 34 are inhibited from accepting the coordinates X=3 and Y=2, by operation of the OR gate 86. All column catch buffer locations having X=3 as their opposite coordinate are masked from future comparison by the mask logic circuits of FIG. 4. The manner of setting of the row catch buffers status circuit must be explained.

The circuits shown in FIG. 7 have reference numerals corresponding to the fail row register 28 and the fail row pointer 36, but identical circuits are employed for the fail column register 30 and the fail column pointer 38, as well as for the row catch buffer 32, the column catch buffer 34 and the row and column pointer 40. The active one of the outputs Q0, Q1, Q2, Q3 of the shift register points 36 (FIG. 7) enables a respective group of logic circuits drawn beneath it on FIG. 7, to transfer data. Each such group includes a twelve bit storage location of the fail row register 28, available for storage of the X coordinate of an original faulty row for which a replacement row is to be auto-assigned. The inverted outputs M0, M1, M2, M3 at lines 83 are the compare outputs of the fail row register 28, which are connected to an inverted wire OR of the row inverter 84 (FIG. 2).

Figure 4:
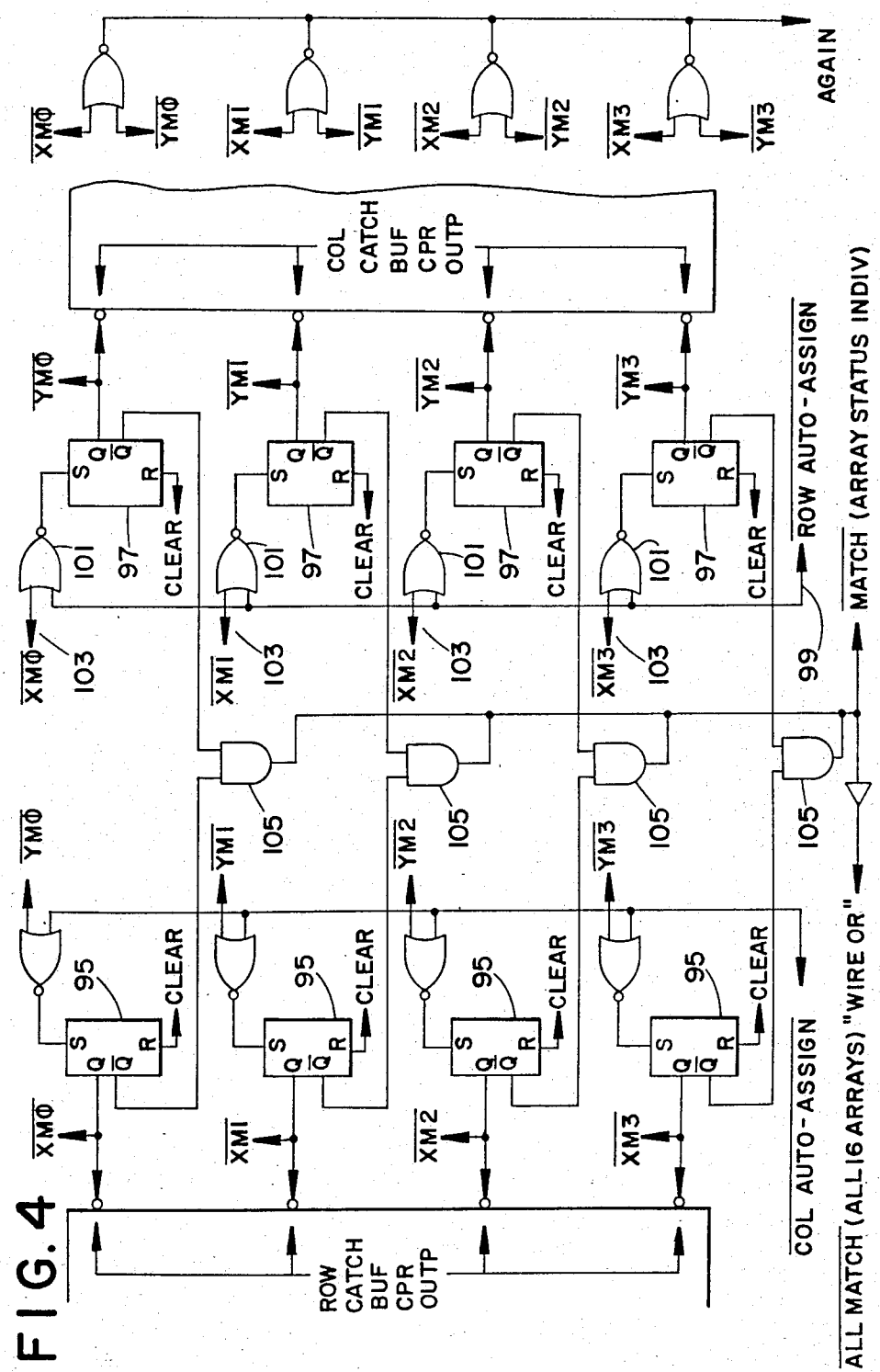
FIG. 4 is a simplified block diagram of an array status logic circuit that is represented on FIG. 2 by the block "row catch buff. status", and an auto-assignment compared mask logic circuit.
Figure 5:
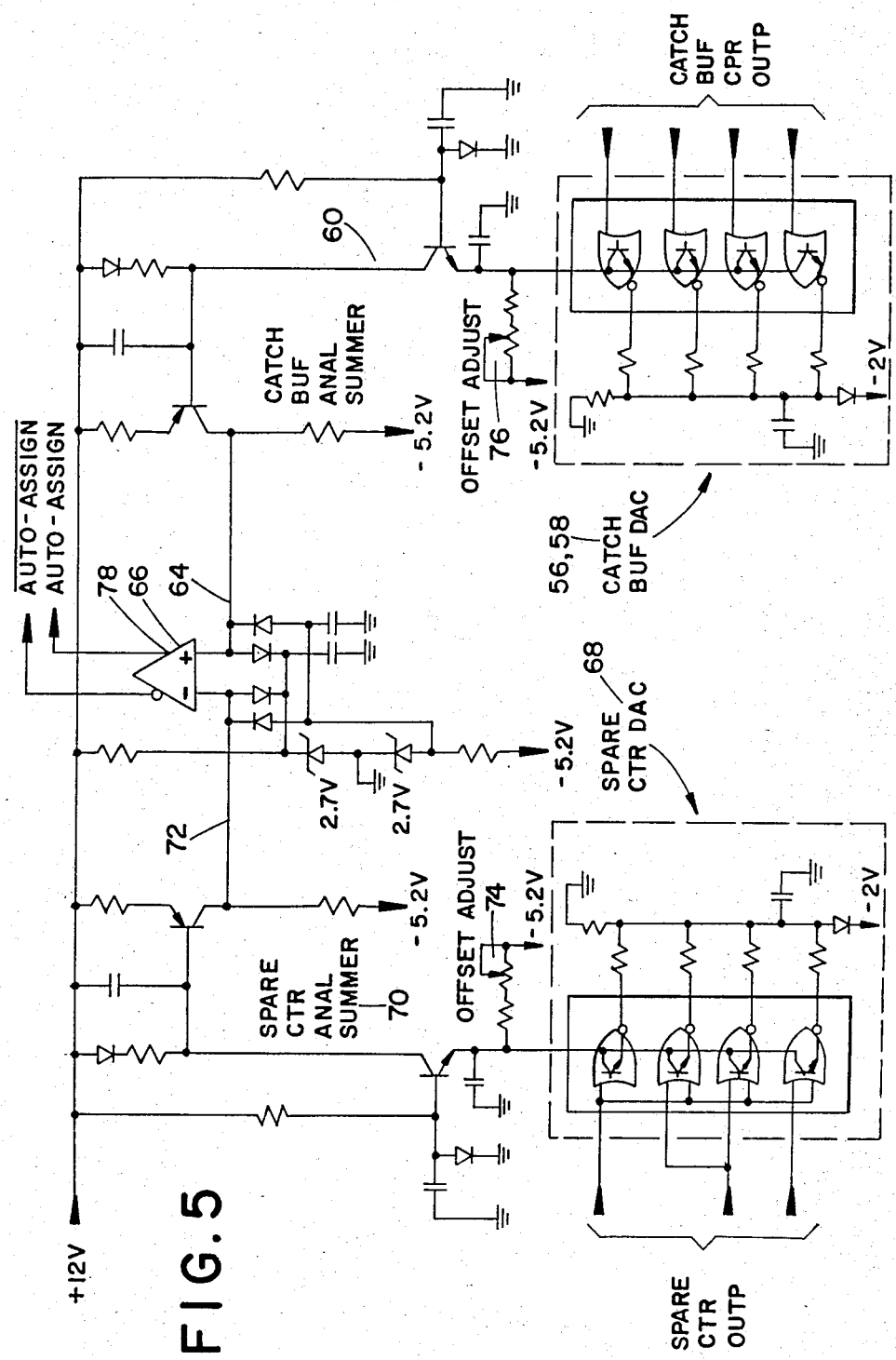
FIG. 5 is a schematic and logic diagram of a high speed digital-to-analog converter and analog summer circuits that are represented only as blocks on FIG. 2.

When the diagram of FIG. 7 represents the row catch buffer 32, the inverted outputs M0, M1, M2, M3 are the compare outputs of the row catch buffer, which are connected to the row catch buffer status register 55 (FIG. 2 and FIG. 4) as well as to the row catch buffer digital to analog converter 56 (FIG. 2 and FIG. 5). The particular compare output MO of the compare outputs 83 provides an indication as to whether or not an X coordinate of an address, which is presented at conductors 42 for the fail row register 28, matches the X coordinate stored in the first location of the fail row register 28. Similarly, each of the other compare outputs M1, etc., indicates whether or not the presented new data (row number) matches the row data that are stored in the second, third, etc., locations of the fail row register 28.

Continuing with the example of FIG. 3, the spare row counter 54 is decremented from two to one. The column catch buffer 34 consequently has an opposite modulus of one, for count comparison purposes. The fail row pointer 36 is advanced one step.

The next failure is detected at X=5, Y=2 (cell 114 on FIG. 3). X=5 is auto-assigned into the fail row register 28 because the number of defects in the original row X=5 exceeds the opposite modulus. Both of the catch buffers 32, 34 are inhibited from storing the new fault address. The spare row counter 54 is decremented from one to zero. Any additional row auto-assignments would result in an abort signal from the spare row counter 54. All locations of the column catch buffer 30 having X=5 as their opposite coordinate are masked from future comparison.

A failure is encountered next at the coordinates X=3, Y=3. X=3 is already in the fail row register 28, so the row inverter 84 has a high output, inhibiting both of the catch buffers 32, 34, and both of the fail registers 28, 30, from accepting the new failure coordinates. When any coordinates are recognized as having already been auto-assigned all pointers 36, 38, 40 and write strobes are inhibited (e.g., the clock terminal on row/column pointer 40 and the inverted WS terminal of row catch buffer 32.)

The coordinates X=5, Y=3 give the location of the next defect. Again the output of the row inverter 84 is high since a redundant row has already been auto-assigned to replace the faulty original row X=5. Both catch buffers and both fail registers are inhibited from accepting the new address.

The next faulty cell's coordinates are X=0, Y=4. Since the spare row counter 54 contains a zero the opposite modulus for the column catch buffer is zero. The coordinate Y=4 is auto-assigned into the first location of the fail column register 30. The catch buffers are both inhibited and the spare column counter 52 is decremented from two to one. The next seven failure addresses all involve Y=4, which has just been auto-assigned, so the catch buffers and fail registers are inhibited from accepting their addresses. Then two failures occur involving rows that have already been auto-assigned, so they aren't recorded.

The next failure occurs at X=0, Y=6. A redundant column is auto-assigned for the repair of the faulty column Y=6 because its opposite modulus is zero. The spare column counter 52 decrements from one to zero. All of the remaining faulty cells in the example of FIG. 3 are on rows or columns which have already been auto-assigned, so the addresses of those cells are not stored.

The contents of the capture array 26 at the conclusion of the real time testing are:

| Fail Row Register |
|---|
| LOC. 1: X = 3 |
| LOC. 2: X = 5 |
| Fail Column Register |
| LOC. 1: Y = 4 |
| LOC. 2: Y = 6 |
| Row Catch Buffer |
| LOC. 1: X = 3 |
| LOC. 2: X = 5 |
| LOC. 3: X = 3 |
| LOC. 4: X = 5 |
| Column Catch Buffer |
| LOC. 1: Y = 0* |
| LOC. 2: Y = 0* |
| LOC. 3: Y = 1* |
| LOC. 4: Y = 1* |
| Spare Row Counter = 0 |
| Spare Col. Counter = 0 |

*Denotes masked from future comparison, because their opposite coordinate were auto-assigned.

The pattern generator 45 not only generates the route along which testing proceeds on a DUT array but also receives, upon completion of the real time testing, the partial or complete collated repair instructions that were devised by the apparatus during the real time testing and stored in the registers of the capture circuit 26. Those repair instructions comprise collated data like that listed above.

Continuing the example of FIG. 3, the pattern generator 45 therefore prepares to read the contents of the registers of the capture circuit 26, but before doing so it performs an intermediate step. It forces the lag register inputs at the conductors 42, 44 to all 1's and does a dummy auto-assignment. This disables all of the unoccupied locations, if any, of both the catch buffers 32, 34 from affecting the status word. The all 1's assignment does not affect the fail registers 28, 30 NOR the spare counters 52, 54.

When the pattern generator 45 reads the status of the row and column catch buffers, in the present example it receives a status indication that every occupied location number of the catch buffer contains the coordinates of a defective cell at least one of whose coordinates was auto-assigned. This tells the pattern generator that the array of FIG. 3 requires no post test data processing. The failure pattern of the DUT in the example is thus processed completely in real time as the test pattern is being executed. The status indication is provided as "match" signals from the status logic circuits of FIG. 4.

Failure patterns which involve coordinates that were not auto-assigned would result in no match status (FIG. 4). The pattern generator 45 would branch to its post test data processing routine and the remaining available repair elements would be assigned, based on the catch buffer and fail register contents, using any convenient assignment algorithm. The post test data processing assignment algorithm is not part of this invention, but the presentation of test data in the collated form listed above is part of it.

Worst case types of fault patterns, which give rise to no auto-assignments, include those in which faulty cells are arranged in a diagonal line of any array. Such fault patterns could require several microseconds of post test data processing by the pattern generator in order to complete the assignments. The pattern generator used with the preferred embodiment of the invention is capable of twenty-five MHz operation. Of course, a DUT may be found during post test data processing to be irreparable.

Figure 12:
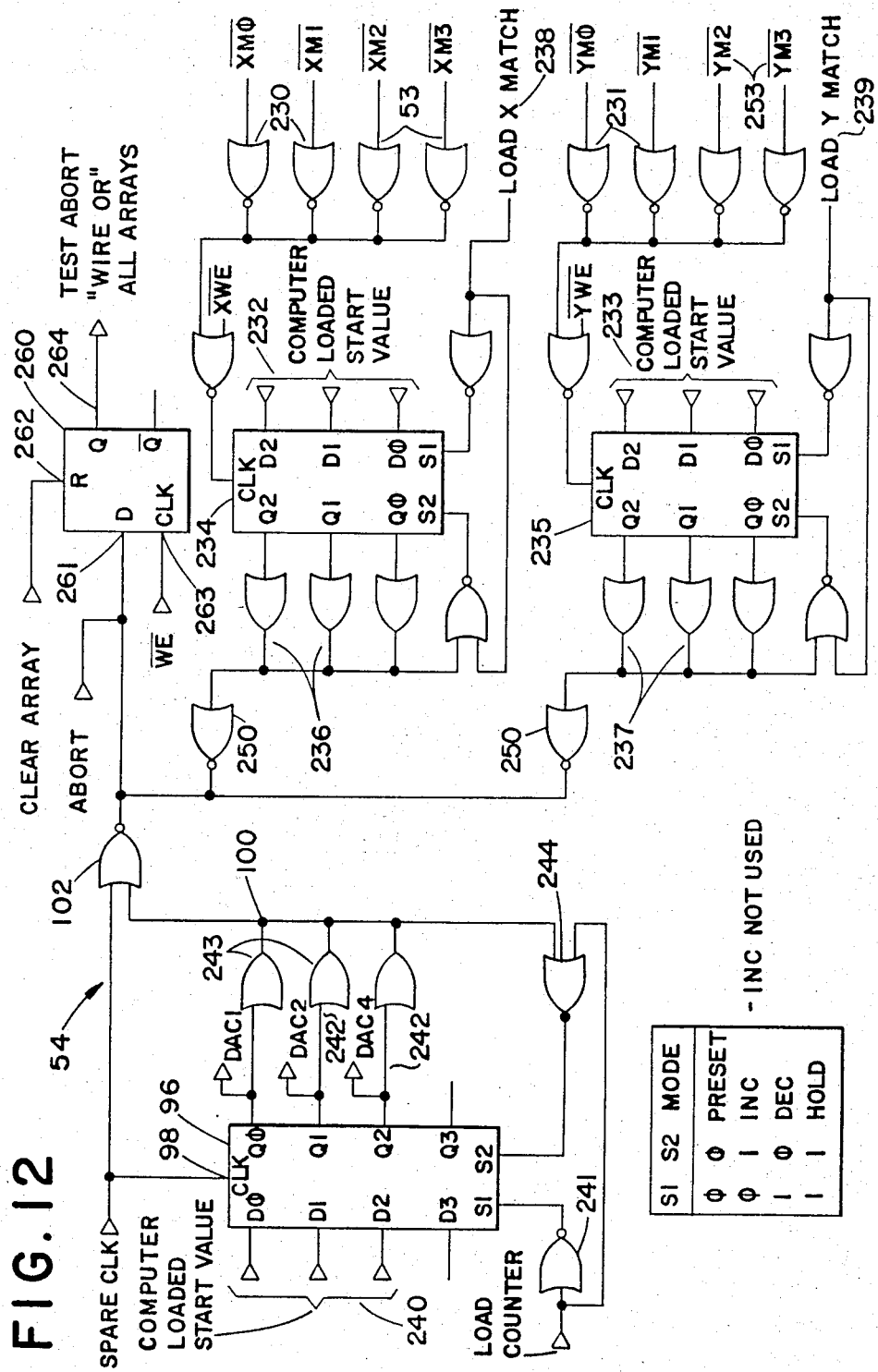
FIG. 12 is an alternate spare counter and abort logic circuit.

With reference to FIG. 12, an alternate version of an abort logic circuit is shown in which the up/down counter 96 is used to trigger an abort signal when the supply of redundant rows and columns has been exhausted and the presence of an additional faulty element is detected.

The counter 96 is initialized by presenting the binary value of the total supply of rows/columns available for replacement to the data lines 240. A logical one signal is then presented to the input of the NOR gate 241, which generates a low signal at S1 and S2 of 96, causing the data present at the input data lines 240 to be transferred to their corresponding output lines 242. The state of the lines 242 are placed through the buffer OR gates 243 and then hard wire ORed together to form a logical one at 100 as long as a non-zero binary value is stored in 96. The presence of the logical one at 100 will cause the NOR gate 244 to input a zero to S2 of 96. The load counter signal at 241 has been taken low placing a logical one at S1 of 96. These combinations of S1=1 and S2=0 will then cause the counter 96 to decrement by a binary one each time a clock pulse is detected at the input 98. Such a pulse is received each time an auto-assignment is called for.

When the supply of redundant rows/columns has been exhausted and an additional redundant element has been called for, the NOR gate 102 receives a logical zero at both inputs and outputs a logical one into the D flip-flop 260. The flip-flop 260 has been preset to a reset state with a zero output during an initialization by a pulsed logical one at input 262. The D flip-flop will change its state to match the logical value at its D input 261, when enabled by a signal at its clock input 263. The presence of a logical one at 261, when the counter 96 has been decremented to zero and has received an additional faulty element signal, causes the D flip-flop to set, and an abort signal, logical one is generated at 264.

Figure 11A:
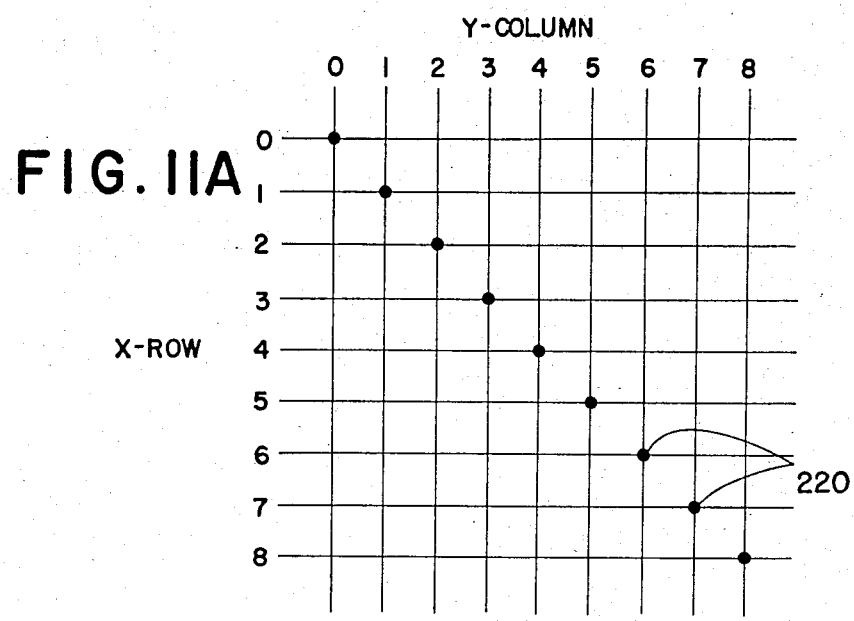
FIG. 11A depicts one possible arrangement of faulty memory cells where each faulty cell is unique to its particular row and column.
Figure 11B:
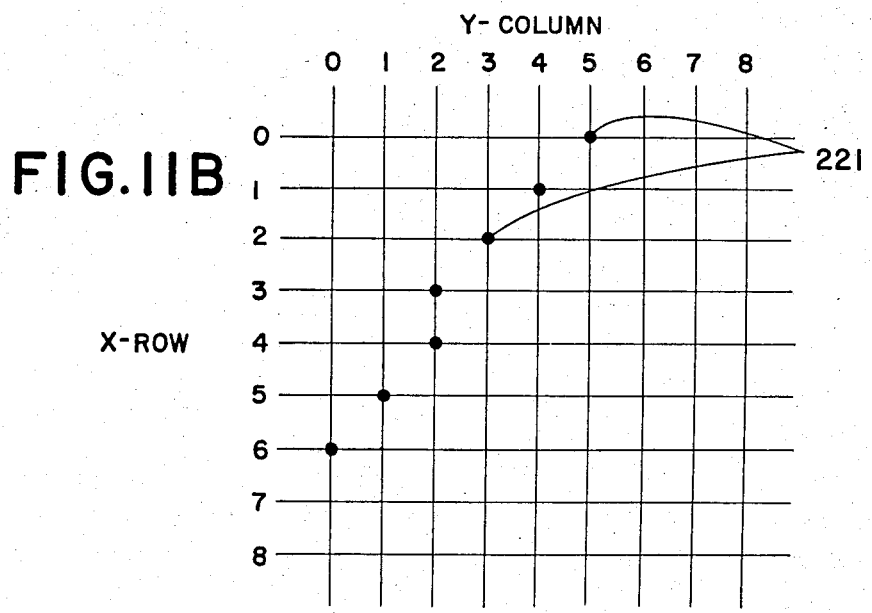
FIG. 11B shows an additional arrangement of faulty elements.

A shortcoming of the detection circuit 96 (FIG. 6) alone is that situations exist in which no auto-assignment has been necessitated, yet the DUT is irreparable. This might occur in situations such as depicted in FIGS. 11A and 11B where it is to be assumed that two redundant rows and two redundant columns were available for replacement at initialization. Note there that each faulty element 220, 221 in FIGS. 11A and 11B has either a row or column unique to the other faulty cells. The array depicted in FIG. 11A has nine elements 220 with unique row coordinates and nine elements with unique column elements. The array depicted in FIG. 11B has seven unique row elements, but only six unique column elements in that the coordinates X=3, Y=2, and X=4, Y=2 lie along the same column. If the opposite modulus defining available redundant replacement elements were not exceeded by a plurality of faulty cells in a common row or column, no auto-assignment will be triggered. Yet when the aggregate of redundant elements has been exceeded by unique row and column faults, the DUT cannot be repaired. The logic circuitry of FIG. 12 will abort the test and reject the DUT as irreparable if such a condition is identified during real time testing.

The counters 234, 235 (FIG. 12) must first be initialized to the maximum number of unique rows or columns which can be replaced with the given supply of redundant elements. By way of example, these quantities may be calculated as follows:

Max unique row coordinates = SR + (SR)(SC)
Max unique column coordinates = SC + (SR)(SC)
Wherein:
 SR = the number of redundant rows initially available
 SC = the number of redundant columns initially available The calculated maximum of unique row or column elements are placed on the data lines 232 and 233 respectively during initialization. A high signal is then placed on 238 and 239, and the data is loaded into the register 234 and 235 respectively, in the same manner as described for counter 96 above.

Unlike the counter 96 which was decremented each time the assignment of a redundant row or element was made, the counters 234 and 235 are only responsive to elements in which no coordinate is shared with a previously defected faulty element. Recall that all previously detected faulty elements have their coordinates placed in the row and column catch buffers 32 and 34 (FIG. 2) respectively.

Referring back to FIG. 4, it can be seen that the signals at the NOR gates 101 at 103 are low only when a previously captured X coordinate is the same as the X coordinate of the faulty cell then being dictated by the pattern generator at 42 (FIG. 2). Therefore, when only logical ones are present at the inputs 103, the coordinate at 42 (FIG. 2) is not shared by any register in the catch buffer, and is hence unique. Similarly, when the generated Y coordinate at 44 (FIG. 2) is unique, the inputs to complementary column match signals will be logical ones.

Turning back to FIG. 12, it will be noted that the inputs 53 and 253 refer to those signals generated by the X match and Y match signals of FIG. 4, noted above. The signals at 53 are isolated and inverted through NOR gates 230 and hard wire ORed together, as are the signals 253 through NOR gates 231. Should a row coordinate be presented which is unique to any value in the row catch buffer 32 (FIG. 2), a pulse will be generated into the clock input of 234, causing the counter to decrement the preset maximum unique row value. Similar results will be reached for unique Y coordinates by the counter 235.

As was noted for the counter 98, when counters 234 or 235 have been decremented to zero, denoting that their maxima have been reached, a logical zero will be presented at either 236 or 237, which is isolated and inverted through NOR gates 250, and hard wire ORed with the abort signal generated by 96, thereby triggering the D flip-flop 261 to set an abort signal logical one at 264.

Therefore, three conditions will trigger an abort in the logic of FIG. 12:
 (1) When the supply of redundant rows/columns has been exhausted and one additional faulty element has been detected (through counter 96); or
 (2) When the maximum number of unique row elements has been exceeded (through counter 234); or
 (3) When the maximum number of unique column elements has been exceeded (through counter 235).

DUT's which can be repaired, and whose repairs can be carried out by means of redundant elements of only one direction, i.e., redundant rows only or redundant spare columns only, are always solved during the real time testing and no post test data processing is required.

Auto-assignments of redundant rows (or columns) to replace faulty rows (or columns) of an array are also written into the fail row (or column) registers of all other arrays that are sharing rows (or columns) with the array having the fault.

A typical post test data processing program involves first the step of sensing the status of a capture circuit to see whether or not its array needs any post test data processing. If it does, the unprocessed values of coordinates are read from the X and Y catch buffers 32, 34 into first and second banks, respectively, of a scratch pad memory 50. The first bank is then searched for repetitions, i.e., for any occurrences of X coordinates more frequent than the number of redundant columns still available. If any such excessively repeated coordinates exist, assignments or rows are made for their repair.

The second bank is then searched for any Y coordinate that appears a greater number of times than the number of redundant rows that are still available. If any such Y coordinate is found, redundant columns are assigned for the repair of the corresponding faulty cells.

After each such search and assignment routing, the remaining unprocessed coordinates from the X and Y catch buffers are entered into the first and second banks of scratch pad memory. If no such repetitions occur, the data are tested to ascertain whether or not the total number of errors remaining is less than the total of the remaining redundant rows and redundant columns, or whether the number of redundant columns remaining is zero or whether the number of remaining redundant rows is zero. If the result is yes, rows or columns are easily assigned to coordinates until the total number of faults remaining is zero. If the result of the foregoing test is no, a trial assignment is undertaken.

The post test data processing program can continue in this way or any of various other ways until either the DUT is found to be irreparable, or a complete assignment plan for its repair by means of redundant rows and columns has been made.

The invention claimed is:

1. A system for testing a redundantly reparable array comprising:
 means for detecting data representing the locations of faulty cells of the array during a testing sequence:
 means for generating a redundancy signal representative of at least one redundant element available for repair of the faulty cells;
 logic circuit means coupled to said detector means and to said signal generating means to provide an output array pattern during the testing sequence which selectively specifies replacement of said faulty cells with a redundant element;

means for generating a signal indicative of a comparison between said redundancy signal and said output array pattern; and abort circuit means coupled to said logic circuit means to provide an abort signal terminating the testing in accordance with said comparison signal.

2. The system as claimed in claim 1 wherein said abort circuit means comprises counter means for counting unique faulty row coordinates and abort logic circuit means for terminating the testing when said unique faulty row coordinates exceed a preselected number.

3. The system as claimed in claim 2 wherein said abort circuit means further comprises means for counting unique faulty column coordinates, and said abort logic circuit means includes means for terminating the testing when said unique faulty columnm coordinates exceed a preselected number.

4. The system as claimed in claim 1 wherein said abort circuit means comprises counter means for counting unique faulty column coordinates, and abort logic circuit means for terminating the testing when said unique faulty column coordinates exceed a preselected number.

5. A method for testing cells that are arrayed in rows and columns to identify faulty cells, and for assigning, as the testing is being executed, redundant rows and columns of cells as replacements for repair of the array, comprising the steps of:

(A) testing the cells sequentially;

(B) comparing a row coordinate and a column coordinate of each of said cells that is identified as being faulty with those of faulty cells that were identified earlier in the sequence and storing the coordinates of said each if fewer than both of the coordinates were previously stored;

(C) assigning a redundant row during the testing sequence to replace a row in which the number of the faulty cells thus far identified in that row exceeds the number of redundant columns that have not as yet been assigned, and assigning a redundant column during the testing sequence to replace a column in which the number of faulty cells in that column thus far identified exceeds the number of redundant rows that have not as yet been assigned; and (D) aborting the testing when, during testing, the number of unique faulty cell coordinates stored thus far exceeds the number of cell coordinates which can be replaced with said redundant rows and columns.

6. The method as defined in claim 5 wherein said aborting comprises the step of indicating that the array is irreparable when, during testing, the number of faulty cell row coordinates stored thus far exceeds $SR+(SR)(SC)$ wherein $SC$ = the number of redundant columns initially available, and $SR$ = the number of redundant rows initially available.

7. The method as defined in claim 6 wherein said aborting comprises the step of indicating that the array is irreparable when, during testing, the number of faulty cell column coordinates stored thus far exceeds $SC+(SR)(SC)$.

8. The method as defined in claim 5 wherein said aborting comprises the step of indicating that the array is irreparable when, during testing, the number of faulty cell column coordinates stored thus far exceeds $SC+(SR)(SC)$ wherein $SR$ = the number of redundant rows initially available, and $SC$ = the number of redundant columns initially available.

* * * * *